United States Patent [19]
Mostafazadeh et al.

[11] Patent Number: 5,894,108
[45] Date of Patent: Apr. 13, 1999

[54] PLASTIC PACKAGE WITH EXPOSED DIE

[75] Inventors: Shahram Mostafazadeh, Santa Clara; Joseph O. Smith, Morgan Hill, both of Calif.

[73] Assignee: National Semiconductor Corporation, Santa Clara, Calif.

[21] Appl. No.: 08/798,967

[22] Filed: Feb. 11, 1997

[51] Int. Cl.$^6$ ..................................................... H01L 23/02
[52] U.S. Cl. ................ 174/52.4; 257/694; 257/713; 257/684; 257/735; 361/714; 361/718
[58] Field of Search ........................... 257/712, 713, 257/695, 735, 696, 694, 690, 693, 684; 361/688, 690, 692, 707, 693, 694, 714, 718; 174/52.1, 52.4

[56] References Cited

U.S. PATENT DOCUMENTS

| | | | |
|---|---|---|---|
| 5,157,480 | 10/1992 | McShane et al. | 257/693 |
| 5,177,669 | 1/1993 | Juskey et al. | 257/675 |
| 5,200,362 | 4/1993 | Lin et al. | 437/207 |
| 5,200,809 | 4/1993 | Kwon | 257/707 |
| 5,273,938 | 12/1993 | Lin et al. | 437/207 |
| 5,276,351 | 1/1994 | Yamazaki et al. | 257/666 |
| 5,296,738 | 3/1994 | Freyman et al. | 257/684 |
| 5,450,283 | 9/1995 | Lin et al. | 361/704 |
| 5,483,098 | 1/1996 | Joiner, Jr. | 257/676 |
| 5,604,376 | 2/1997 | Hamburgen et al. | 257/676 |

*Primary Examiner*—Kristine Kincaid
*Assistant Examiner*—Hung V. Ngo
*Attorney, Agent, or Firm*—Skjerven, Morrill, MacPherson, Franklin & Friel LLP; Edward C. Kwok

[57] ABSTRACT

A molded plastic package incorporates a lead frame which includes a plurality of leads radially aligned around a central opening. A die is mounted in the central opening and is electrically connected to the leads by wire bonding. A molded plastic casing is formed over the die, wiring and lead frame to encapsulate the package. The lower surfaces of the die and lead frame are exposed through the package. A method for making the molded plastic package includes mounting the die and lead frame onto an adhesive tape, electrically connecting the die to the leads by wire bonding, forming a molded plastic casing over the die, wire bonding and lead frame, and then removing the adhesive tape to expose the lower surfaces of the die and the lead frame.

3 Claims, 3 Drawing Sheets

5,894,108

PLASTIC PACKAGE WITH EXPOSED DIE

FIELD OF THE INVENTION

This invention relates to integrated circuit packages and in particular to molded plastic packages.

BACKGROUND OF THE INVENTION

Several surface mounted package types are currently in use, including plastic leaded chip carriers (PLCC), plastic quad flat packs, small outline packages and ball grid array (BGA) packages. Each package type supports an IC chip, or "die", and provides interconnections between the die and a printed circuit board (PCB).

FIG. 1 shows an example of a typical molded IC package 10. A lead frame 20 is the central supporting structure of the molded IC package 10 to which all other elements are attached. The lead frame 20 is etched or stamped from a thin metal strip to form a pattern of narrow leads 22 radially arranged around a central die attach platform 24 upon which a die 30 is mounted via an epoxy resin 40. The die 30 has a lower surface 32 contacting the epoxy resin 40 and an opposing upper surface 34 facing away from the die attach platform 24, and includes die bond pads 36 located on the upper surface 34. The die bond pads 36 are electrically connected to the leads 22 of the lead frame 20 by fine-diameter gold wires 50 using well established wire bond techniques. The lead frame 20, die 30 and wires 50 are covered with a thermoset plastic casing 60 using an operation called transfer molding. As indicated in FIG. 1, the plastic casing 60 includes an upper portion 62 formed over and contacting the upper surface 34 of the die 30, and a lower portion 64 formed under and contacting a lower surface 25 of the die attach platform 24. After transfer molding, leads 22 of lead frame 20 are plated, trimmed and formed to complete the molded IC package 10.

A problem with conventional molded IC package 10 is that, because the plastic casing 60 completely surrounds the die 30, heat dissipation from the die 30 is resisted. More specifically, the heat generated by the die 30 during normal operation must pass through the upper portion 62 of the plastic casing 60, and through the epoxy resin 40, die attach portion 24 and lower portion 64 of the plastic casing 60. Due to the insulating properties of the plastic casing 60, this heat dissipation is resisted, thereby creating, in some instances, high temperatures within the package 10 which can impair or damage the die 30.

A second problem is the physical size (thickness) of the conventional molded IC package 10. Specifically, the epoxy resin 40, die attach platform 24 and lower portion 64 of the plastic casing 60 substantially increase the overall thickness of the conventional molded IC package 10.

A third problem associated with the conventional molded IC package 10 is that the assembly process is complicated by the steps of applying the epoxy resin 40 onto the die attach platform 24, and then placing the die 30 onto the epoxy resin 40.

SUMMARY OF THE INVENTION

In accordance with the present invention, a plastic molded package is provided which incorporates a lead frame structure surrounding a die and encased by a plastic material, wherein a surface of the die and the lead frame are exposed through a molded plastic casing, thereby exposing the die for enhanced thermal performance. Further, the thickness of the inventive package is reduced when compared with the conventional plastic IC package (discussed above) because the inventive package eliminates the die attach pad and lower portion of the plastic casing which are used in the conventional package. Moreover, the inventive package is produced using a simplified assembly method in that the steps of applying epoxy resin and mounting the die on the die attach platform of the conventional package are eliminated.

In accordance with the present invention, the lead frame of the plastic molded package includes a plurality of leads extending radially away from the centrally-located die. The die has an upper surface which is electrically connected to an upper surface of the leads by wire bonding. A molded plastic casing is formed over the die, wiring and lead frame to encapsulate the package. Lower surfaces of the die and lead frame are exposed through the plastic casing. To increase the heat transfer rate, the package may be mounted on a printed circuit board such that the die is mounted on a heat sink structure.

Also in accordance with the present invention, a method for producing a plastic molded package includes mounting a die and a lead frame on an adhesive tape such that the lead frame surrounds the die, wire bonding the die to the lead frame, forming a molded plastic casing over the die, wire bonding and lead frame, and, finally, removing the adhesive tape to expose a lower surface of the die and the lead frame.

BRIEF DESCRIPTION OF THE DRAWINGS

These and other features, aspects, and advantages of the present invention will become better understood with the following description, appended claims, and accompanying drawings where:

DETAILED DESCRIPTION OF THE PREFERRED EMBODIMENTS

Figure 7:
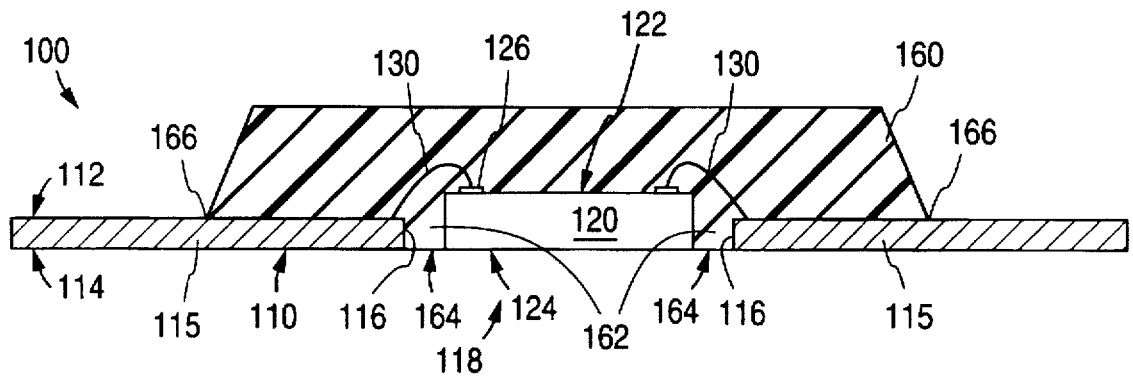
FIG. 7 is a cross-sectional view of a plastic molded package in accordance with the present invention.

FIG. 7 shows a cross-sectional view of an electronic device 100 incorporating a plastic package formed in accordance with the present invention.

Referring to FIG. 7, the device 100 incorporates a substantially flat lead frame 110 having an upper (first) surface 112 and an opposite lower (second) surface 114. The lead frame 110 includes a plurality of radial leads 115 extending from a central opening 118. An integrated circuit die 120 is located in the central opening of the lead frame 110 such that it is spaced from the free ends 116 of the leads 115. The die 120 includes an upper (first) surface 122 and a lower (second) surface 124, and also includes a plurality of die bond pads 126 located on the upper surface 124. The die bond pads 126 are electrically connected to the integrated circuit (not shown) which is fabricated on the die 120, and are also electrically connected to the upper surfaces 112 of selected leads 115 via wires 130 using known wire bond techniques. A plastic casing 160 is formed over lead frame 110, die 120 and wires 130 for protection.

Figure 1:
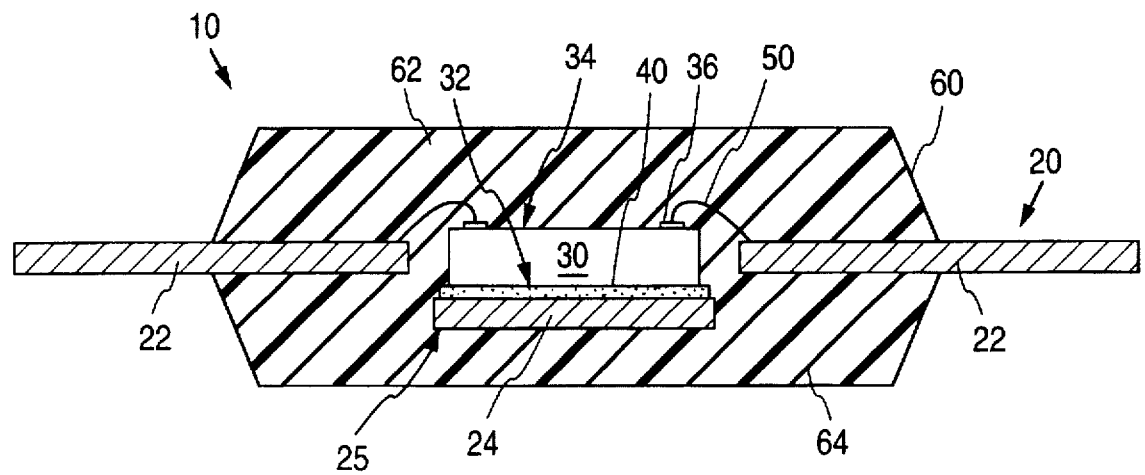
FIG. 1 shows a cross-sectional view of a conventional molded IC package.

In accordance with a first aspect of the present invention, the lower surfaces 114 and 124 are exposed through the plastic casing 160, thereby facilitating rapid heat dissipation from the die 120, and thereby enhancing thermal performance of the electronic device 100. In particular, when the electronic device 100 is mounted on a circuit board in a "cavity up" arrangement (i.e., such that the lower surfaces 114 and 124 face a surface of the circuit board), the die 120 can be mounted directly onto a heat sink formed on the circuit board. The direct contact between the die 120 and the heat sink provides significantly better heat dissipation over that of the known enclosed-die package shown in FIG. 1 of the present application. The electronic device 100 can also be beneficially used in a "cavity down" arrangement (i.e., such that the lower surfaces 114 and 124 face away from the circuit board) by providing suitable ventilation and/or a heat sink structure mounted directly onto the die 120.

In accordance with a second aspect of the present invention, the lower surface 114 of the lead frame 110 is co-planar with a lower surface 124 of the die 120. This arrangement yields a very low-profile package when compared with the known enclosed-die package shown in FIG. 1 of the present application.

FIGS. 2–6 show a method for producing an electronic device using the plastic package formed in accordance with the present invention.

Figure 2A:
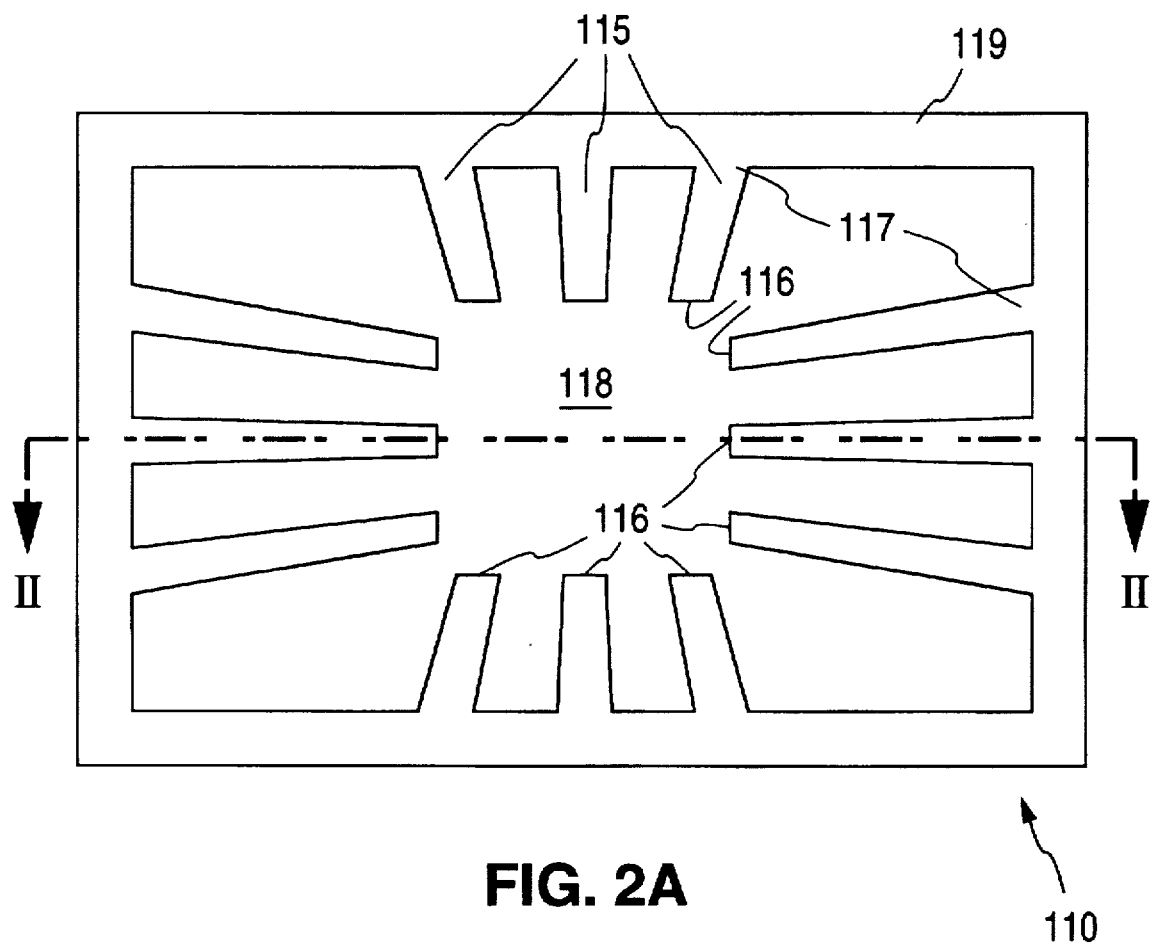
FIGS. 2A and 2B are top and cross-sectional side views of a lead frame in accordance with an embodiment of the present invention.
Figure 2B:
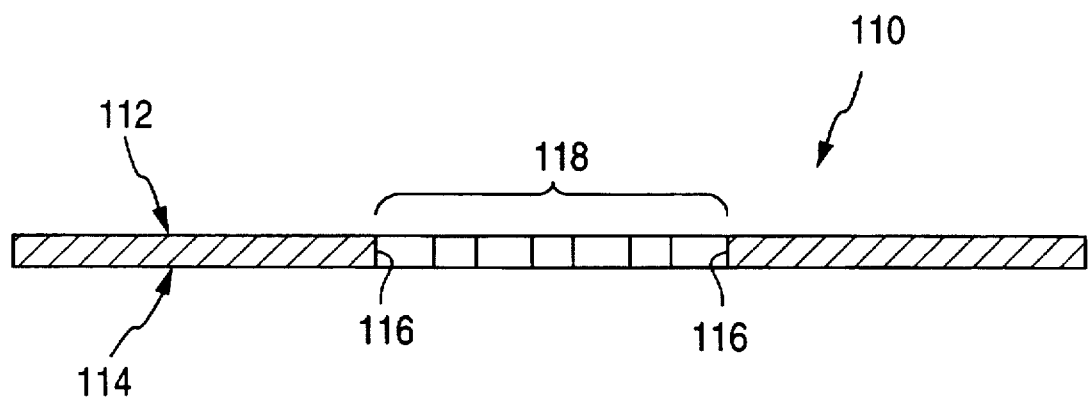

Referring to FIGS. 2A and 2B, the lead frame 110 is formed from a thin metal (e.g., copper) strip which has been etched or stamped to form a pattern similar to that shown in FIG. 2A. The upper (first) surface 112 and the opposing lower (second) surface 114 are indicated in FIG. 2B. Each of the radial leads 115 has a free end 116 and a fixed end 117. The free ends 116 of the plurality of leads 115 surround and define the central opening 118. The fixed ends 117 of the leads 115 are connected to a skirt 119, which is removed after the plastic casing 160 is formed, as described below. It is noted that the lead frame 110 shown in FIG. 2A is simplified for clarity. A lead frame 110 used in an actual package may have a different shape than that shown in FIG. 2A, and typically includes many more leads 115.

Figure 3:
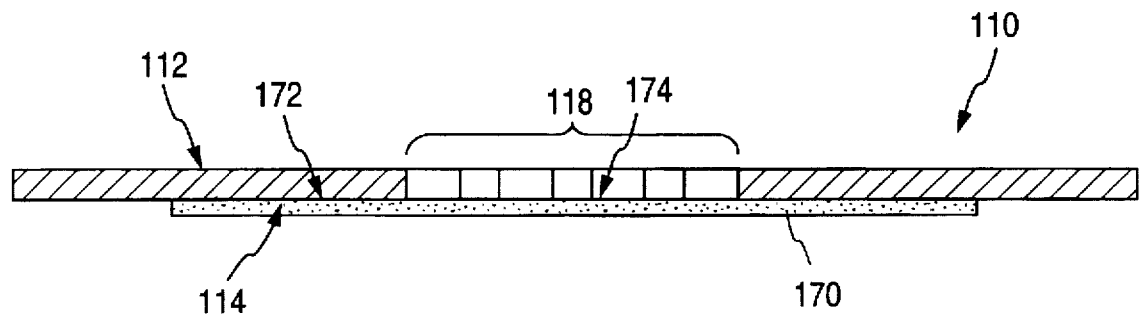
FIG. 3 shows a cross-sectional side view of the lead frame, mounted on an adhesive tape.

Referring to FIG. 3, the lead frame 110 is mounted on an adhesive tape 170 such as polyimide with an adhesive layer. The purpose of the adhesive tape 170 is to support the die 120 and lead frame 110 during the assembly process, and to maintain the die 120 in a proper location relative to the lead frame 110. Specifically, the lower surface 114 of the lead frame 110 contacts a sticky surface 172 of the adhesive tape 170, and the upper surface 112 of the lead frame faces away from the adhesive tape 170. A central portion 174 of the adhesive tape 170 remains exposed through the central opening 118 of the lead frame 110.

Figure 4:
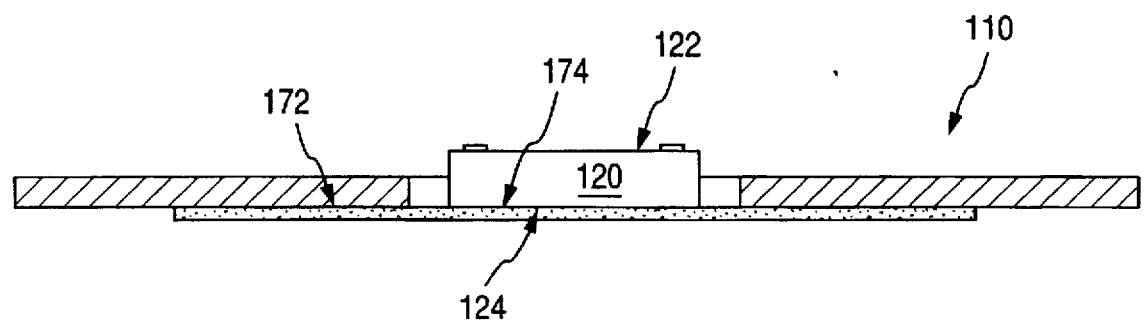
FIG. 4 shows a cross-sectional side view of a die mounted in a central opening of the lead frame.

Referring to FIG. 4, the die 120 is then mounted on the central portion 174 of the adhesive tape 170. Specifically, the die 120 is positioned in the central opening 118 such that the lower surface 124 of the die 120 contacts the sticky surface 172 of the adhesive tape 170, and the upper surface 122 of the die 120 faces away from the adhesive tape 170. The sticky surface 174 supports the lead frame 110 and the die 120 such that the lower surfaces 114 and 124 are co-planar.

Figure 5:
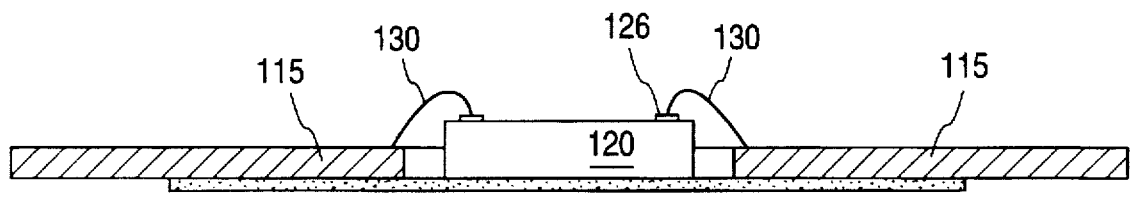
FIG. 5 shows a cross-sectional side view of the die wire bonded to the lead frame.

Referring to FIG. 5, wires 130 are then connected between the die bond pads 126 and the leads 115 using known wire bond techniques.

Figure 6:
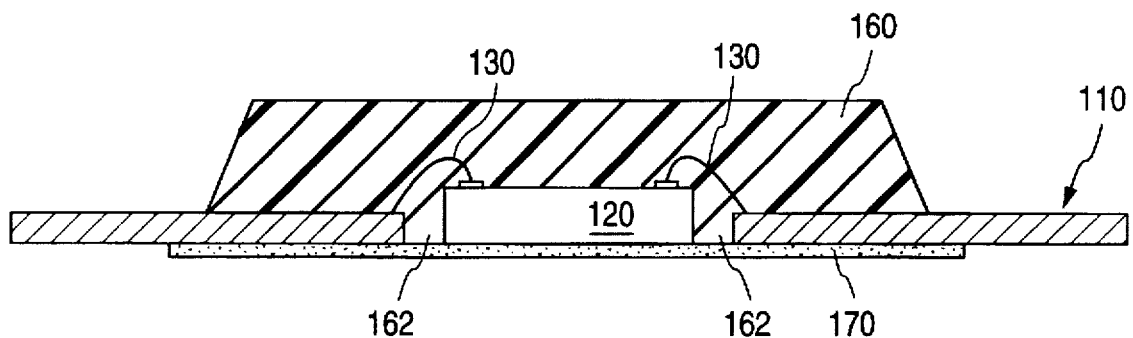
FIG. 6 shows a cross-sectional view of a molded plastic casing formed over the assembly of FIG. 5.

Referring to FIG. 6, the molded plastic casing 160 is then formed over lead frame 110, die 120 and wires 130 using known plastic molding methods (such as transfer molding) while the lead frame 110 and die 120 remain mounted on the adhesive tape 170. During the molding process, liquified molding material flows onto exposed portions of the adhesive tape 170 which are located between the die 120 and the free ends 116 of the lead frame, and between the leads 115. This molding material solidifies to form intervening portions 162 which serve to maintain the relative positions of the die 120 and leads 115. After encapsulation, skirt 118 is removed by trimming.

Finally, as shown in FIG. 7, the adhesive tape 170 is removed from the die 120 and the lead frame 110, thereby exposing the lower surface 124 of the die 120, the lower surface 114 of the lead frame 110, and lower surfaces 164 of the intervening portions 162, all of which are co-planar.

The device 100 shown in FIG. 7 can be attached to a circuit board using several possible methods. For example, a BGA package format may be obtained by trimming the leads 115 such that they are flush with a side surface 166 of the plastic casing 160, and attaching solder balls or columns to the lower surfaces 114 of the leads 115. Alternatively, the skirt 119 can be removed by cutting the leads 115 near the fixed ends 117, and then bending the leads to provide contact with a circuit board.

While particular embodiments of the present invention have been shown and described, it will be obvious to those skilled in the art that changes and modifications may be made without departing from this invention in its broader aspects. For example, the lead frame may have any known configuration, and is not intended to be limited to the construction of lead frame 110 shown in FIGS. 2A and 2B. Further, the steps of mounting the die 120 and lead frame 110 onto the adhesive tape 170 shown in FIGS. 3 and 4 may be reversed. Moreover, glob top material may be used in place of the molded plastic casing 160. Therefore, the appended claims are to encompass within their scope all such changes and modifications as fall within the true spirit and scope of this invention.

What is claimed is:

1. An electrical device comprising:

a flat lead frame including plurality of leads and an opening, the lead frame having opposing first and second surfaces;

an integrated circuit die disposed in the opening of the lead frame, the die including opposing first and second surfaces and having a plurality of die bond pads located on the first surface;

a plurality of wires, each of the plurality of wires extending from one of the die bond pads to one of the plurality of leads; and a plastic casing formed on the first surface of the die, the plurality of wires, and the first surface of the lead frame;

wherein;

the second surface of the die is exposed through the plastic casing, and the second surface of the die and the second surface of the lead frame are co-planar, the plastic casing includes opposing first and second surfaces; and the second surface of the plastic casing and the second surface of the lead frame are co-planar.

2. The electrical device of claim 1, wherein the plastic casing comprises molded plastic.

3. The electrical device of claim 1, wherein the second surface of the lead frame is exposed through the plastic casing.

* * * * *